United States Patent
Chiappetta et al.

(10) Patent No.: US 6,724,791 B1
(45) Date of Patent: Apr. 20, 2004

(54) METHOD AND APPARATUS FOR CONTROLLING THE TEMPERATURE OF A LASER MODULE IN FIBER OPTIC TRANSMISSIONS

(75) Inventors: Joseph F. Chiappetta, Shelton, CT (US); James Jamra, Madison, CT (US)

(73) Assignee: C-COR.net Corp., State College, PA (US)

( * ) Notice: Subject to any disclaimer, the term of this patent is extended or adjusted under 35 U.S.C. 154(b) by 0 days.

(21) Appl. No.: 10/188,944

(22) Filed: Jul. 2, 2002

(51) Int. Cl.$^7$ ................................................ H01S 3/04
(52) U.S. Cl. ........................................ 372/36; 372/34
(58) Field of Search ...................... 372/36, 34; 385/92; 359/341.1

(56) References Cited

U.S. PATENT DOCUMENTS

| | | | |
|---|---|---|---|
| 5,034,334 A | 7/1991 | Flynn et al. ................. 437/8 |
| 5,181,214 A * | 1/1993 | Berger et al. ................ 372/34 |
| 5,329,539 A * | 7/1994 | Pearson et al. .............. 372/36 |
| 5,379,145 A | 1/1995 | Nodine ....................... 359/187 |
| 5,495,489 A * | 2/1996 | Lee et al. .................... 372/34 |
| 5,675,604 A * | 10/1997 | Durkin et al. ................ 372/75 |
| 5,734,771 A * | 3/1998 | Huang ......................... 385/93 |
| 5,870,417 A | 2/1999 | Verdiell et al. .............. 372/32 |
| 6,018,536 A | 1/2000 | Alphonse ..................... 372/23 |
| 6,027,256 A * | 2/2000 | Nightingale et al. ......... 385/92 |
| 6,072,815 A * | 6/2000 | Peterson ...................... 372/36 |
| 6,181,718 B1 * | 1/2001 | Kobayashi et al. ........... 372/34 |
| 6,219,364 B1 | 4/2001 | Dei .............................. 372/36 |
| 6,226,424 B1 | 5/2001 | Ball et al. ..................... 385/14 |
| 6,230,497 B1 * | 5/2001 | Morris et al. ................. 62/3.7 |
| 6,433,921 B1 * | 8/2002 | Wu et al. ...................... 359/334 |
| 6,522,459 B1 * | 2/2003 | Pease et al. .................. 359/341.4 |

OTHER PUBLICATIONS

WO 01/50643 Published Jul. 12, 2001 Chiappetta et al.

\* cited by examiner

*Primary Examiner*—Paul Ip
*Assistant Examiner*—Phillip Nguyen
(74) *Attorney, Agent, or Firm*—Price & Adams

(57) ABSTRACT

A semiconductor laser diode for transmitting optical signals in a telecommunications network is housed within a module supported adjacent to a thermoelectric cooling element that is mounted in thermally conductive contact with a heat sink. The cooling element is positioned externally on the surface of the module. The adjacent surface areas of the module and the cooling element are brought into thermal conductivity by a thermally conductive filler occupying the space between the module and the cooling element. The filler conforms to the configuration of the adjacent surfaces of the module and the cooling element to increase the thermal conductivity therebetween for maximum efficiency in the transfer of heat from the laser diode through the module to the cooling element and the heat sink. In response to a change in the temperature of the laser diode, the current applied to the cooling element is adjusted to increase or decrease the current and accordingly sink heat from the laser diode or supply heat to the laser diode. By removing the cooling element from internally within the laser module, the manufacturing cost of the laser module is substantially reduced.

20 Claims, 3 Drawing Sheets

METHOD AND APPARATUS FOR CONTROLLING THE TEMPERATURE OF A LASER MODULE IN FIBER OPTIC TRANSMISSIONS

BACKGROUND OF THE INVENTION

1. Field of the Invention

This invention relates to method and apparatus for assembling a laser module in a telecommunications network and, more particularly, to a thermoelectric cooling element positioned externally of the laser module for maintaining the operating temperature of the laser module.

2. Description of the Prior Art

In a conventional cable television (CATV) system optical transmitters are used to convert radio frequency (RF) signals to optical signals. The conversion is provided by a laser diode which transmits AM modulated or digitally modulated optical signals for communication over a fiber optic CATV distribution network. The laser diode is coupled to a fiber optic network suitable for use in optical transmissions.

Laser diode devices are sensitive to operating conditions such as temperature, modulating signal level, and the loss or improper application of current which biases the laser diode to its stimulated or laser emission state. As the ambient temperature of the optical transmitter increases or decreases, unequal thermal expansion of the components creates stresses on the components which can alter their optical characteristics. For example, the optical beam emitted from the laser diode is focused to a modulator. Thermal stresses applied to the laser diode misalign the optical beam, resulting in a reduction in the output of the optical transmitter. Therefore, the laser diode must be maintained at a stable operating temperature, i.e. within a range of plus or minus two degrees.

In a conventional optical communications system, the laser diode and the other optical components in the system are buried in underground conduits and the like, exposing them to extreme environmental conditions. The optical elements may be exposed to ambient temperatures ranging from −30° C. to about 50° C. Because the oscillation characteristics of a semiconductor laser diode have a large temperature dependency, if the module is not maintained at a constant temperature, shifts in the threshold current density or oscillation wavelength may take place depending on temperature variation.

In order to accommodate the temperature variations to which the laser diode is exposed and to avoid wavelength shifts, it is the conventional practice to hold the operating temperature of the laser diode by a Peltier-element electronic cooling device. By keeping the operating temperature of the laser diode at a constant temperature, the operating bias and, therefore, the total optical transmission of the optical signal is maintained at a constant level under extreme environmental conditions and in response to electrical disturbances.

An example of the prior art semiconductor laser module using an electronic cooling device in an optical communication system is disclosed in U.S. Pat. No. 6,181,718 in what is commonly referred to as a butterfly-type module package. A semiconductor laser diode is mounted on a carrier which is coupled internally to an electronic cooling device. The cooling device includes a Peltier-element having a pin junction sandwiched between a first dielectric plate substrate and a second dielectric plate substrate. To avoid a temperature increase in the diode, a temperature detector, such as a thermistor-resistor, is installed around the diode. With this arrangement, the temperature around the diode is maintained by the supply current to the Peltier-element. A change in the temperature is detected by the thermistor and in response actuates an increase or decrease of the electric current to the Peltier-element. The current is increased to increase the rate of heat flow from the diode and thereby cool the diode back to the operating temperature. When the temperature measured by the thermistor is lower than the operating temperature, the electric current to the Peltier-element is decreased to decrease the rate of heat flow from the laser diode. The heat generated in the diode raises the temperature thereof back to the operating temperature.

With the above-described butterfly-type module construction, the thermoelectric cooling element is mounted internally within the package in contact with the laser diode. The package is formed by a hermetically sealed metal-ceramic or metal-glass rectangular package with multiple leads protruding from opposite sides of the package. External electronic circuitry is used to control the operation of the internal cooling element. However, this configuration adds significantly to the cost of manufacture of the laser diode module.

Another example of a laser diode module having an internally packaged thermoelectric cooler (TEC) is disclosed in U.S. Pat. No. 5,181,214. All the elements of the laser diode module are mounted to a common, temperature stabilized base plate. The base plate is fabricated of a low thermal expansion material, such as copper-tungsten alloy. The base plate is mounted on a thermoelectric cooler, which in turn is mounted on a heat sink. The thermoelectric cooler controls the rate of heat flow between the base plate and the heat sink in order to maintain the temperature of the laser diode at a predetermined operating temperature.

In U.S. Pat. No. 5,379,145, an optical transmitter for light wave communications utilizes a thermistor thermally coupled with a laser diode in a module. Also, thermally coupled to the laser diode is a thermoelectric cooler. The TEC is connected to a controller responsive to voltage developed across the thermistor to turn current to the TEC on and off to cool the laser diode when its temperature exceeds a certain temperature. The other components are within the package.

In the multichannel analog optical fiber communication system disclosed in U.S. Pat. No. 5,034,334, the laser diode chip is mounted on a metallized carrier. The carrier is in turn attached to a copper stud cooled by a conventional thermoelectric cooling element to maintain the laser diode at about 20° C.

Conventional integrated optical transmitter in a CATV system includes an optical head assembly generating a formed optical beam and an optical modulator which receives the formed optical beam for modulation. An optical head assembly is maintained in a fixed relationship by an epoxy bonding to the modulator. The optical head includes a laser diode that is coupled to the modulator for transmitting an optical beam to the modulator. A thermal transfer plug couples a rear portion of the optical head assembly to a TEC to transfer heat therebetween. A second TEC is coupled by adhesive directly to the optical head. TECs are conventionally operable to remove or add heat from the modulator and optical head assembly to maintain optimum operating temperature. Further, it is disclosed that a thermistor is mounted in the transfer plug to monitor the temperature of the optical head assembly. All these components are contained in an integrated package.

Another example of a butterfly type module package for a semiconductor laser diode in an optical fiber telecommunications system is disclosed in U.S. Pat. No. 6,219,364. A laser diode chip and a thermistor are mounted via a heat sink on a submount. The submount is in turn mounted on a metal substrate. The metal substrate is bonded by a hard metal solder to the top of a Peltier-element. The Peltier-element is in turn sandwiched by ceramic panels so that the cooler element is internally mounted within the module beneath the laser diode.

Another example of a thermoelectric cooling element mounted internally within the laser diode package is disclosed in U.S. Pat. No. 6,018,536. An integrated laser package includes a gain element supported on a high thermal conductive submount in alignment with a fiber of an optical coupling means which is also supported on the submount. The submount is in turn supported on a TEC cooler. Thus, all the elements are heat sunk to the same support in an integrated package and maintained at the same temperature.

One disadvantage of an integrated laser module where the thermoelectric cooling element is contained within the module is the high manufacturing cost of the integrated design. Internally mounting the TEC element requires a support structure for positioning the laser diode on top of the TEC element. This requires hermetically sealing the TEC element in a metal-ceramic or metal-glass rectangular package and soldering the package to a substrate for supporting the laser diode above the TEC element. The manufacturing cost of a laser diode module would be substantially reduced by fabricating the module with the TEC element positioned externally of the module. This would eliminate many of the components required to support the TEC element internally in heat transfer relation with the laser diode. Therefore, there is need in a laser diode module for mounting the thermoelectric cooling element externally of the module to reduce the manufacturing cost of the module.

SUMMARY OF THE INVENTION

In accordance with the present invention, there is provided a laser diode assembly in a telecommunications network that includes a module of a preselected configuration housing the laser diode. A thermoelectric cooling element has opposing surfaces. A first of the opposing surfaces is a controlled surface maintained at a selected operating temperature. A second of the opposing surfaces is an uncontrolled surface for transfer of heat to and from the cooling element. A heat sink is positioned in thermal contact with the cooling element second surface. The module has a heat transfer surface positioned in spaced relation oppositely of the cooling element first surface. A thermally conductive material fills the space between the module heat transfer surface and the cooling element first surface. The thermally conductive material conforms to the surface configurations of the module and the cooling element to place the module in thermal contact with the cooling element for transfer of heat therebetween. A measuring device is supported by the conductive material for detecting a change in the temperature of the cooling element first surface from the operating temperature. The temperature applied to the cooling element is adjusted to transfer heat between the module, the cooling element, and the heat sink to maintain the cooling element at the operating temperature.

Further in accordance with the present invention there is provided a method for assembling a laser diode in a telecommunications network that includes the steps of housing a laser diode within a laser module having an outer surface fabricated of a thermally conductive material. The laser module is connected to a telecommunications network for the transmission of optical signals thereto. A thermoelectric cooling element is positioned oppositely of the laser module to transfer heat therebetween. The cooling element is positioned in thermal contact with a heat sink for transfer of heat between the cooling element and the heat sink. A thermally conductive material is inserted between and in contact with opposing surfaces of the laser module and the cooling element to place the laser module and the cooling element in thermal contact for the transfer of heat therebetween. The temperature of the cooling element is measured to detect a change in the temperature of the laser module from a preselected temperature in response to heat transferred from the laser module to the cooling element. The electric current supplied to the cooling element is adjusted to transfer heat between the laser module and the heat sink through the cooling element to maintain a preselected temperature of the laser module.

In addition the present invention is directed to apparatus for controlling the temperature of a semiconductor laser diode that includes a module housing the laser diode in thermal contact therewith. The module has a thermally conductive surface of a preselected configuration. A thermoelectric cooling element is positioned in heat transfer relation with the module. The cooling element has a thermally conductive surface of a preselected configuration. A heat sink is positioned in thermal contact with the thermoelectric cooling element. A thermally conductive filler material is positioned between the module and the cooling element in conformity with the configurations of the thermally conductive surfaces of the module and the cooling element to place the module and the cooling element in thermal contact for the transfer of heat between the laser diode and the heat sink.

Accordingly, a principal object of the present invention is to provide method and apparatus for maintaining the operating temperature of a semiconductor laser diode in a module or package by a cooling element independently controlled and positioned externally of the module and maintained in thermal conductivity with the module for a transfer of heat therebetween.

Another object of the present invention is to provide apparatus for housing a semiconductor laser diode in a package free of the electrical components associated with a temperature controller housed externally of the package.

Another object of the present invention is to provide method and apparatus for positioning a thermoelectric cooling element externally of a housing for a laser module where the adjacent surfaces of the cooling element and laser module are placed in thermal conductivity by a thermally conductive filler material conforming to the adjacent surfaces.

Another object of the present invention is to provide a package for housing a semiconductor laser diode used in a telecommunications network where the manufacturing cost of the package is reduced by using a TEC element externally of the package.

A further object of the present invention, is to provide a package for a semiconductor laser module in a telecommunications network having a temperature control device positioned externally in thermal contact with the module.

These and other objects of the present invention will be more completely disclosed and described in the following specification, the accompanying drawings, and the appended claims.

DESCRIPTION OF THE PREFERRED EMBODIMENTS

Figure 1:
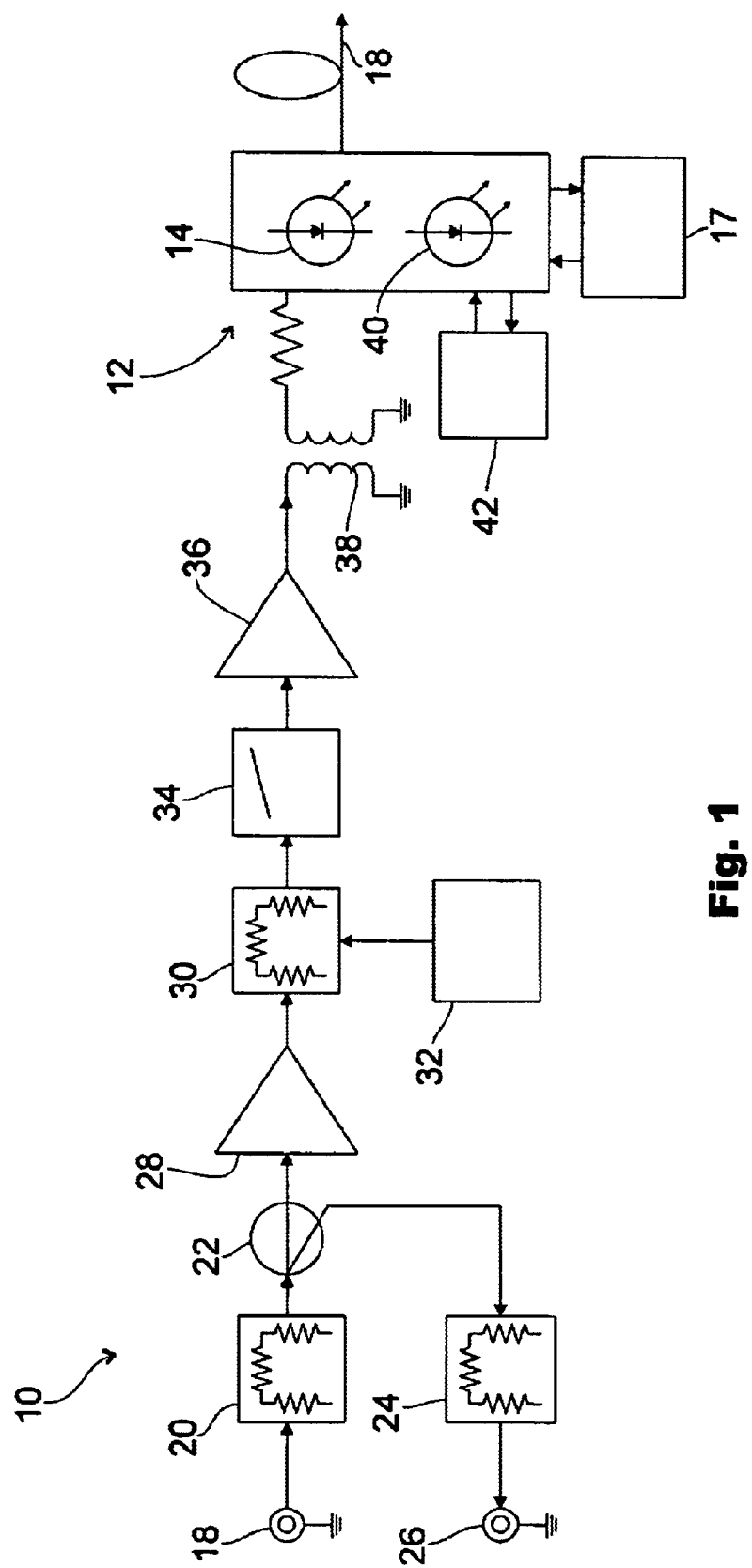
FIG. 1 is an electrical schematic of an optical communications system, illustrating a semiconductor laser diode for converting RF electrical signals to optical signals for transmission over a CATV distribution network.

Referring to the drawings and particularly to FIG. 1, there is illustrated an optical communications system generally designated by the numeral 10 for conversion of an RF input signal to an optical output signal. The RF signal is converted by a laser module 12 that includes a semiconductor laser diode 14 maintained at a constant temperature by a thermoelectric cooling element 16 (shown in FIGS. 2 and 3) positioned externally of the laser module 12 and controlled by a control circuit 17. The converted RF signal is transmitted from the laser module 12 through the output glass fiber 18 in a communications system, such as a CATV system.

The output optical signal has a magnitude which is proportional to the operating bias current of the laser diode 14. Modulation of the bias current by an external signal varies the power of the optical output signal in proportion to the applied signal. With this arrangement, all of the signal information and the applied signal is transferred to the optical signal by intensity modulation. In accordance with the present invention, the RF signal converted by the laser diode 14 must be of low distortion and high quality, requiring that the laser diode 14 be held at a constant operating temperature and at a fixed operating bias current as the surrounding ambient temperature varies.

A RF modulating signal, such as a broadband CATV signal including a number of television channels, is applied to an input terminal 18 of an input attenuator 20. The RF signal from the attenuator 20 is transmitted to an input coupler 22 which splits the signal for transmission in one direction for feedback through a monitor attenuator 24 to an input monitor 26. The other path of the RF signal from the coupler 22 is directed to preamplifier 28 where the RF signal is amplified and transmitted to a variable attenuator 30 operated by a controller 32. The attenuator 30 receives the amplified signal from the amplifier 28 and transmits an attenuated signal to an equalizer 34, which equalizes the signal. The equalizer 34 then feeds the equalized signal to a laser driver-amplifier 36.

The RF amplified signal from amplifier 36 is transmitted through a transformer 38 to the laser module 12 containing the laser diode 14 and an output monitor diode 40. The laser module 12 also includes a laser bias electrical device 42. The thermoelectric cooling element 16 is positioned externally in thermal contact with the laser module 12, as shown in FIGS. 2 and 3.

The bias control device 42 controls the operating bias of the RF signal to ensure that the power of the optical output signal transmitted from the laser module 12 is maintained at a constant level. The thermoelectric cooling element 16 assures that the laser module and subsequently the laser diode 14 are maintained at a constant operating temperature. The RF signal is converted by the laser diode to the desired optical signal transmitted to the output fiber 18.

Figure 2:
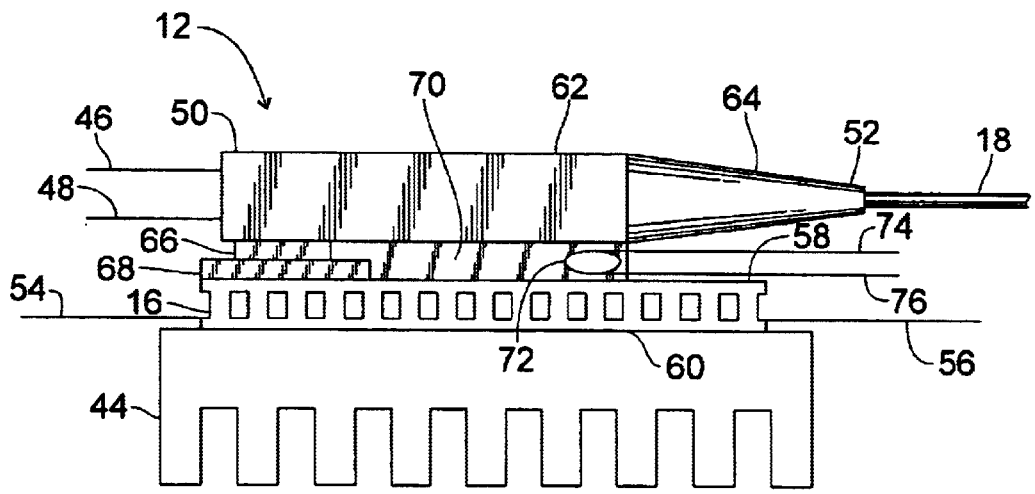
FIG. 2 is a view in side elevation of a laser module thermally connected externally to a thermoelectric cooling element.
Figure 3:
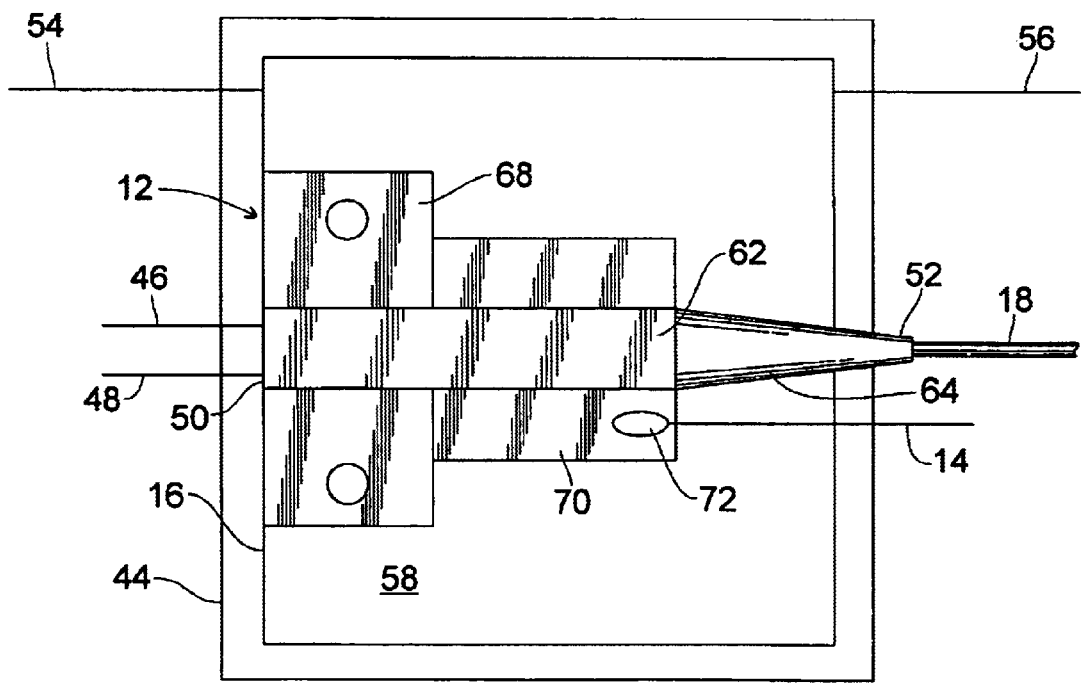
FIG. 3 is a top plan view of the laser diode shown in FIG. 1, illustrating the external positioning of the thermoelectric cooling element.

Now referring to FIGS. 2 and 3, there is illustrated the laser module 12 positioned externally in thermal contact with the thermoelectric cooling element 16. The cooling device 16 is positioned in thermal contact with a heat sink 44. Therefore, the opposing surfaces of the cooling element 16 are positioned in heat transfer relation with the laser module 12 and the heat sink 44.

In accordance with the present invention, the laser module 12 is manufactured without the provision for internal temperature control, i.e. without a TEC element housed within the module 12. Consequently, without the addition of the cooling element 16 within the laser module 12, there is no capability to control the temperature of the laser diode 14 housed within the module 12. In this respect, without the provision of the cooling element 16, the laser module 12 is subject to the deleterious effects of variations in ambient temperature. The exclusion of a TEC element 16 from internally within the laser module 12 eliminates the need to fabricate the module 12 to include electrical leads for connecting the cooling element to the control electronics for the element.

As illustrated in FIGS. 2 and 3, the only wiring required for the module 12 is for the laser bias and RF signal input leads 46 and 48 connected to input end 50 of module 12. The optical signal generated by the laser diode 14 is transmitted to the output fiber 18 connected to an output end 52 of module 12. No other leads are required to be connected externally to the module 12. With the cooling element 16 positioned externally on the laser module 12, electrical leads 54 and 56 connect the cooling element to the control electronics for controlling the temperature of the cooling element 16.

The thermoelectric cooling element 16 has opposing surfaces 58 and 60 that are used to control and maintain a constant operating temperature of the laser diode 14 within module 12. The surface 58 is in contact with the body of laser module 12, and surface 60 is in contact with the heat sink 44. The surface 58 in contact with the laser module 12 is designated the controlled side of element 16. The surface 60 in contact with the heat sink 44 is designated the uncontrolled or environmental side of the cooling element 16.

In operation, the thermoelectric cooling element 16 responds to temperature changes of the laser module 12. In the event the temperature of the laser module 12 increases above a preset level, the cooling element 16, being in heat transfer relation with module 12, transfers or pumps heat from the module 12 to the heat sink 44. The heat sink 44, being in heat transfer relation with the cooling element 16, absorbs the thermal energy transferred from the module 12 to the cooling element 16. Thus, the heat sink 44 acts as a heat transfer medium and removes heat absorbed by the laser module 12 due to variations in ambient temperature and transfers the heat from the cooling element 16 to the ambient air surrounding the heat sink 44.

The laser module 12 is in thermal contact with the temperature controlled surface 58 of the thermoelectric cooling element 16. The efficiency of the cooling element 16 to transfer heat from the laser module 12 to the heat sink 44 is determined by the surface area of the laser module 12 in thermal contact with the temperature controlled surface 54 of the cooling element 16. The greater the area of thermal contact of laser module 12 with the cooling element 16, the greater the thermal conductivity between the respective surfaces and the greater the transfer of heat from the laser module 12. Accordingly, by increasing the area of thermal contact between the laser module 12 and the cooling element 16, the thermal conductivity between the laser module 12 and the cooling element 16 is increased.

The thermal conductivity between the laser module 12 and the cooling element 16 is maximized when the surface of the laser module 12 conforms to the flat surface 58 of the cooling element 16. If the opposing surfaces are not in conformity, i.e. the thermal area of contact between the laser module 12 and the cooling element 16 is minimal, then the heat transferred between the respective surfaces will be minimal resulting in low thermal efficiency of the cooling element 16 to transfer heat from the laser module 12 to the heat sink 44. In operation where the thermal efficiency of the cooling element is low, the electric current to the cooling element 16 must be increased to increase the rate of heat transfer from the laser module 12 through the cooling element 16 to the heat sink 44 to maintain the desired operating temperature of the laser module 12.

The optimum or desired thermal conductivity between the laser diode 12 and the cooling element 16 is achieved when the opposing heat transfer surfaces are in conformity, i.e. maximum thermal conductivity between opposing surfaces. Most preferably, maximum thermal conductivity between the laser module 12 and the cooling element 16 is achieved when the opposing surfaces are flat. When a substantial portion of the surface of the laser module 12 is flat and conforms with the opposite flat surface 58 of the cooling element 16, maximum heat transfer occurs.

If a substantial portion of the surface of the laser module 12 does not conform to the surface configuration of the cooling element 16, then the thermal conductivity and heat transfer efficiency is substantially minimized. In one example, this occurs when the surface of laser module 12 is round or arcuate in configuration and the surface 58 of the cooling element 16 is flat, as shown in FIGS. 2 and 3. In this embodiment the thermal contact area between the opposing surfaces is minimal, resulting in low thermal conductivity.

Conventionally, the body of the laser module 12 is fabricated to include a combination of planar and radial surfaces, as shown in FIGS. 2 and 3. For example, a center body portion 62 of module 12 extending from end portion 50 has a radial configuration of a constant diameter. A conical section 64 extends from the body portion 62 to the output end 52 from which the laser fiber 18 extends.

The radial body portion 62 of the module 12 includes a mounting flange 66 for supporting the module 12 on the flat surface 58 of cooling element 16 (FIG. 2). The mounting flange 66 includes a rectangular base plate 68 having a planar surface abutting the planar surface 58 of cooling element 16. Only the base plate 68 of the laser module 12 is in thermal contact with the cooling element 16. Consequently, the thermal conductivity between the laser module 12 and the cooling element 16 is low. This results in low thermal efficiency of the cooling element 16 to withdraw and transfer heat from the laser module 12. In accordance with the present invention the thermal efficiency is increased by increasing the area of thermal contact between the laser module 12 and the cooling element 16.

To increase the thermal conductivity between the substantially radial body of the laser module 12 and the flat surfaces of the cooling element 16, a filler 70 of thermally conductive material is positioned between the laser module 12 and the cooling element 16 in conformity with the opposing surfaces of module 12 and element 16. The filler 70 is molded or machined, depending upon the material from which the filler is fabricated, into conformity with the opposing surfaces which contact the filler 70.

Preferably, the filler 70 is fabricated from a thermally conductive material. Metal is one class of thermally conductive material used for the filler 70. In one embodiment, aluminum is machined or molded to conform to the configuration of the surfaces of the module 12 and element 16 as the thermally conductive material therebetween.

In another embodiment, the thermally conductive filler 70, such as a thermally conductive epoxy, is injected into the void between module 12 and element 16 and fills the void by conforming to the surfaces of the radial portion 62 of module 12, the rectangular configuration of the module mounting flange 66 and base plate 68, and the flat or planar surface 58 of the cooling element 16. The thermally conductive filler 70 conforms substantially to all the surrounding thermal contact surfaces of the laser module 12 and the cooling element 16. In this manner maximum thermal conductivity and consequently thermal efficiency is achieved to maintain the laser diode 14 at an operating temperature.

In accordance with the present invention, regardless the external configuration of the laser module 12 and the cooling element 16, the opposing surfaces thereof are brought into maximum thermal contact with one another by filling the voids or spaces between the non-conforming surfaces with the thermally conductive material 70. The filler material 70 is molded in place or shaped by machining to place the heat transfer surfaces of module 12 and element 16 in thermal contact. Maximizing the thermal efficiency of heat transfer from module 12 through element 16 to heat sink 44 minimizes the current that must be supplied to the cooling element 16 to maintain the laser module 12 at the desired operating temperature. A further function of the filler material 70 is to operate as a saddle to support the laser module 12 in thermal contact with the cooling element 16.

The filler material 70 between the laser module 12 and the cooling element 16 is a thermally conductive material. Consequently, when the temperature of the laser module 12 changes, the temperature of the cooling element 16 changes. A temperature-sensing element 72, such as a thermistor, is used to monitor the temperature of the controlled surface 58 of the cooling element 16. The thermistor 72 is suitably secured to the surface of the thermally conductive filler 70. For example as shown in FIGS. 2 and 3, the thermistor 72 is positioned in a hole formed on the surface of the filler 70. A thermally conductive epoxy is inserted in the hole and in surrounding relation with the thermistor 72 to securely bond the thermistor 72 to the filler 70. A pair of electrical leads 74 and 76 extend from the thermistor 72 to a In operation, any change in the ambient temperature surrounding the laser module 12 leads to a change in the temperature of the conductive filler 70 and the temperature of surface 58 of the cooling element 16. The temperature change is sensed by the thermistor 72, which continually measures the cooling element surface 58. The thermistor 72 is responsive to the temperature change and adjusts the electric current supplied to the cooling element 16, accordingly.

When the temperature measured by the thermistor 72 exceeds the initially specified operating temperature of the laser module 12, the electric current to the thermoelectric cooling element 16 is increased. This increases the rate of heat flow from the laser module 12 through the cooling element 16 to the heat sink 44. In this manner, the laser module 12 is cooled to the specified operating temperature.

When the temperature measured by the thermistor 72 is lower than the operating temperature, the electric current to the thermoelectric cooling element 16 is decreased. This decreases the rate of heat flow from the laser module 12 to the heat sink 44. In this manner, the heat generated in the laser module 12 raises the temperature of the module 12 back to its operating temperature.

With the above-described arrangement, the laser module 12 is maintained as a constant operating temperature without the provision of integrating the thermoelectric cooling element 16 within the laser module. The cooling element 16 is positioned externally of the laser module 12 and maintained in high thermal contact therewith. The desired thermal conductivity between the externally mounted cooling element 16 and the laser module 12 is enhanced by the provision of the thermally conductive filler material 70 to bring the nonconforming, displaced surfaces of the laser module 12 and cooling element 16 into thermal contact. The conductive filler material 70 bonds the opposing surfaces together irrespective of the surface contour of the opposing surfaces. Thus, the surfaces normally not in thermal contact are brought into thermal contact.

A reduced cost in the manufacture of the laser module 12 is realized by eliminating the expense of integrating a cooling element within the laser module. Specifically, the electrical leads 54 and 56 for the cooling element 16 are removed from internal connection to the laser module. Also, the temperature sensing element 72 is eliminated from the laser module 12 and incorporated within the filler material 70 in thermal conductivity with the surface of the cooling element 16.

The cooling element 16 being in high thermal conductivity with the laser module 12 responds to changes in the temperature of the laser module. A change in the temperature of the temperature controlled surface 58 of the cooling element 16 is sensed by the thermistor 72 in response to a temperature change in the laser module 12. This arrangement is effective to maintain the laser module 12 at a constant operating temperature over a wide range of ambient temperature changes. Thus, the laser module 12 is maintained at an operating temperature by temperature control devices positioned externally of the laser module 12.

Figure 4:
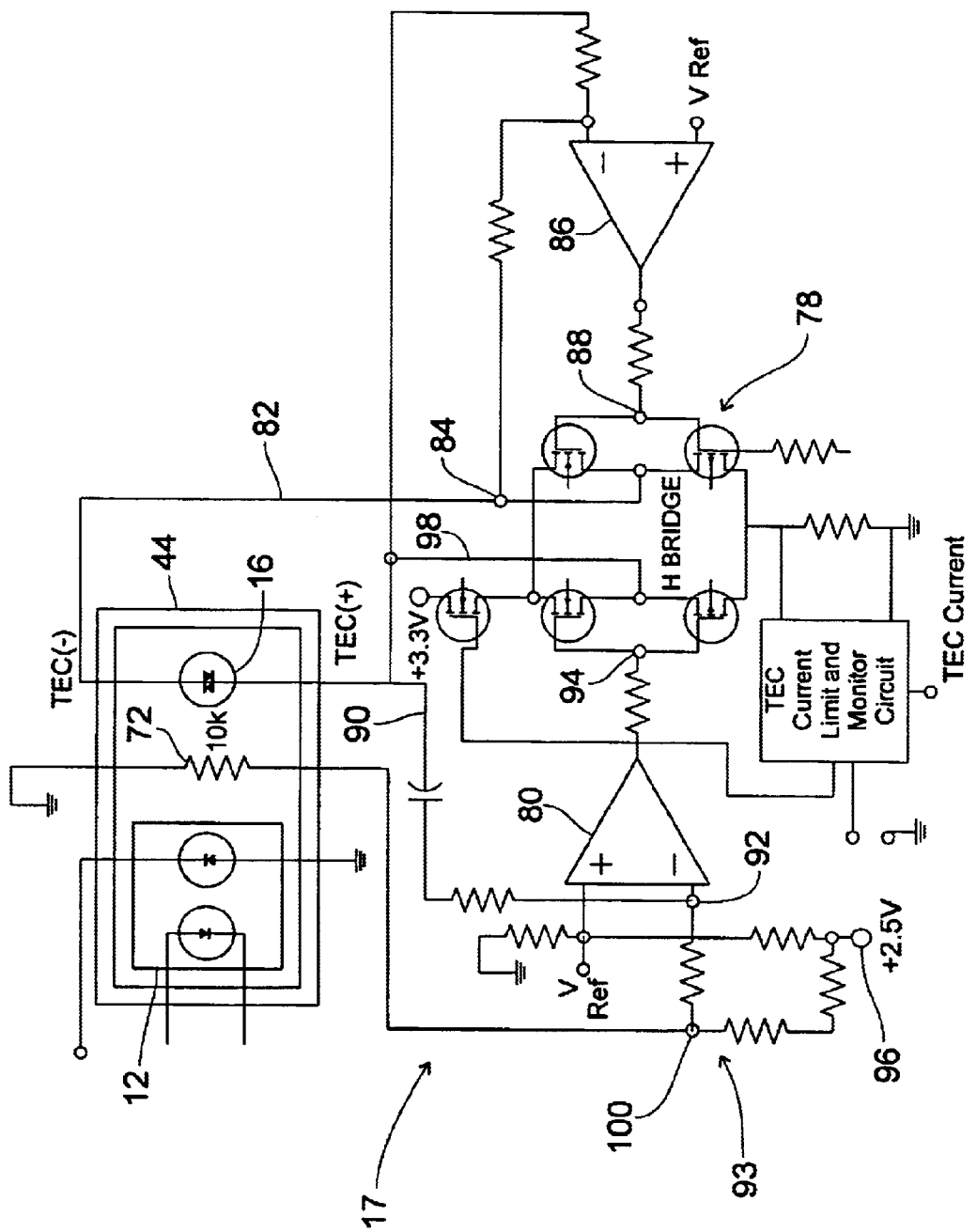
FIG. 4 is an electrical schematic of a control circuit for maintaining the temperature of the laser diode at a constant temperature over a wide ambient temperature range.

Now referring to FIG. 4, there is illustrated the circuit 17 for controlling the temperature of the thermoelectric cooling unit 16 to maintain the thermistor 72 and consequently the operating temperature of the laser diode 14 within the module 12 at a selective operating temperature. With the circuit 17, the laser diode 14 is held substantially at a constant temperature over a wide ambient temperature range. The temperature is maintained at a +/- 2 degree window as the ambient temperature varies, for example, over a 65 degree or more range. The temperature is controlled by the circuit 17, which is also maintained externally of the laser module 12. The circuit 17 is operable as a temperature sensing and control feedback monitor circuit.

As above discussed, the Peltier cooling element 16 is externally mounted in thermal contact with the laser module 12. The cooling element 16 is connected at its negative terminal by conductor 82 to output terminal 84 of one half of the H-bridge circuit 78 that is connected to an output terminal 88 of an operational amplifier 86. The second half of the H-bridge circuit 78 is connected to the positive terminal of the cooling element 16 by conductor 98 which is connected to terminal 92 of operational amplifier 80. Amplifier 80 is actuated by the thermistor 72 responding to a change in the temperature of the cooling element 16 in contact with the laser module 12.

The operational amplifier 80 is connected to terminal 94 of the H-bridge circuit 78 and a temperature bridge circuit generally designated by the numeral 93. The current supplied to the positive terminal of the cooling element 16 is either increased to increase the rate of heat flow from the laser module 12 (sourced) or decreased to decrease the rate of heat flow from the laser module 12 (sinked). The current to the cooling element 16 is either increased or decreased (sourced or sinked) depending upon whether the potential of the H-bridge circuit 78 at the terminal 88 is higher or lower than the potential of the H-bridge circuit 78 at terminal 94.

Supplying current to the positive terminal of the cooling element 16 by operation of the H-bridge circuit 78 increases the heat transferred from the laser module 12 to cool the laser module. Decreasing the flow of current to the positive terminal of the cooling element 16 decreases the rate of heat flow from the laser module 12 to increase the temperature thereof. In this manner, heat is pumped in either direction between the cooling element 16 and the heat sink 44.

As disclosed in FIGS. 2 and 3, the laser module 12 and the thermistor 72 are positioned in thermal contact through the conductive filler 70 to the temperature controlled surface 58 of the thermoelectric cooling element 16. The uncontrolled side 60 of the cooling element 16 is mounted on the heat sink 44. The temperature sensing thermistor 72 is connected through the operational amplifier 80 to the H-bridge circuit terminal 94. The voltage at the terminal 94 is proportional to the resistance of thermistor 72, which is a function of the absolute temperature of the laser module 12. The opposite terminal 88 of the H-bridge circuit 78 is set at a voltage which is equal and opposite to the voltage at terminal 94, which corresponds to the resistance of the thermistor 72.

The laser module 12 is maintained at the desired operating temperature, for example 23° C. Any variation in the temperature of the laser module 12 unbalances the temperature bridge circuit 93, producing an error voltage at driver input terminal 100. The error voltage at the terminal 100 is applied by the operational amplifier 80 to terminal 94 of the H-bridge circuit 78. The applied voltage results in a drive current through conductor 90 into and out of the positive terminal of the cooling element 16. The drive voltage is inverted by the operational amplifier 86 at the terminal side 88 of H-bridge circuit 78. This produces an equal but opposite current at the terminal side 88 of circuit 78.

The outputs at each side of the H-bridge circuit 78 in the case of an increase in the rate of heat transfer from the laser module 12 increases the current to the cooling element 16. In the case when the temperature measured by the thermistor 72 is lower than the laser diode operating temperature, the electric current to the cooling element 16 is decreased. This decreases the rate of heat flow from the cooling element 16 to the heat sink 44 and allows the temperature of the laser module 12 to rise back to the operating temperature. The amount and direction of the current is based upon the need to maintain the thermistor 72 and consequently the operating temperature of the laser diode 12 at an initial operating temperature.

According to the provisions of the patent statutes, we have explained the principle, preferred construction, and mode of operation of our invention and have illustrated and described what we now consider to represent its best embodiments. However, it should be understood that, within the scope of the appended claims, the invention may be practiced otherwise than as specifically illustrated and described.

We claim:

1. A laser diode assembly in a telecommunications network comprising:

a module of a preselected configuration housing the laser diode, a thermoelectric cooling element having opposing surfaces, a first of said opposing surfaces being a controlled surface maintained at a selected operating temperature and a second of said opposing surfaces being an uncontrolled surface for transfer heat to and from said cooling element, a heat sink positioned in thermal contact with said cooling element second surface, said module having a heat transfer surface positioned oppositely of said cooling element first surface, a thermally conductive material filling the space between said module heat transfer surface and said cooling element first surface, said thermally conductive material having at least one surface conforming to said module heat transfer surface and to said cooling element first surface to place said module in thermal contact with said cooling element for transfer of heat therebetween, and a measuring device mechanically supported by said conductive material for detecting a change in the temperature of said cooling element first surface from the operating temperature and adjusting the current applied to said cooling element to transfer heat between said module, said cooling element, and said heat sink to maintain said cooling element at the operating temperature.

2. A laser diode assembly in a telecommunications network as set forth in claim 1 which includes, said thermoelectric cooling element being positioned externally of said module.

3. A laser diode assembly in a telecommunications network as set forth in claim 1 in which, said thermally conductive material thermally connects said module to said controlled surface of said thermoelectric cooling element.

4. A laser diode assembly in a telecommunications network as set forth in claim 1 in which, said thermally conductive material includes metallic material having a machined surface conforming to the configuration of said module heat transfer surface and said cooling element first surface to place said surfaces in thermal contact.

5. A laser diode assembly in a telecommunications network as set forth in claim 1 in which, said thermally conductive material fills the space between said module and said thermoelectric cooling element and is molded to conform to the configuration of the opposing surfaces of said module and said thermoelectric cooling element for the transfer of heat therebetween.

6. A laser diode assembly in a telecommunications network as set forth in claim 1 in which, said measuring device includes a thermistor for monitoring the temperature of said cooling element first surface, and said thermistor being secured to the surface of the thermally conductive material and including electrical leads extending therefrom.

7. A method for assembling a laser diode in a telecommunications network comprising the steps of:

housing a laser diode within a laser module having an outer surface fabricated of a thermally conductive material, connecting the laser module to a telecommunications network for the transmission of optical signals thereto, positioning a thermoelectric cooling element oppositely of the laser module for transfer of heat therebetween, positioning the cooling element in thermal contact with a heat sink for transfer of heat between the cooling element and the heat sink, inserting a thermally conductive material between and in contact with opposing surfaces of the laser module and the cooling element to place the laser module and the cooling element in thermal contact for the transfer of heat therebetween, measuring the temperature of the cooling element to detect a change in the temperature of the laser module from a preselected temperature responsive to heat transferred from the laser module to the cooling element, and adjusting the electric current applied to the cooling element to transfer heat between the laser module and the heat sink through the cooling element to maintain a preselected temperature of the laser module.

8. A method for assembling a laser diode as set forth in claim 7 which includes, positioning a portion of the laser module in abutting contact with the cooling element, and inserting the thermally conductive material in the space between the opposing surfaces of the laser module and the cooling element to increase the area of thermal contact between the laser module and the cooling element and bring the opposing surfaces into thermal conductivity.

9. A method for assembling a laser diode as set forth in claim 7 which includes, thermally connecting the laser module to cooling element by the thermally conductive material conforming to the configuration of opposing surfaces of the laser module and the cooling element.

10. A method for assembling a laser diode as set forth in claim 7 which includes, injecting the thermally conductive material as a filler in the void between the laser module and the cooling element, and conforming the thermally conductive filler to the configurations of the opposing surfaces of the laser module and the cooling element to bring the laser module and the cooling element into thermal conductivity.

11. A method for assembling a laser diode as set forth in claim 10 which includes, fabricating the filler from a thermally conductive material including a metallic material, and machining the metallic material into conformity with the configurations of the opposing surfaces of the laser module and the cooling element to provide thermal conductivity therebetween for the transfer of heat between the laser module and the cooling element.

12. A method for assembling a laser diode as set forth in claim 7 which includes, bringing the opposing surfaces of the laser module and the cooling element into thermal contact by filling the space therebetween with the thermally conductive material to increase the area of thermal contact between the laser module and the cooling element.

13. A method for assembling a laser diode as set in claim 7 which includes, conforming the thermally conductive material to the configurations of the thermal contact surfaces of the laser module and the cooling element to provide for maximum thermal conductivity between the surfaces.

14. A method for assembling a laser diode as set forth in claim 7 which includes, securing a temperature sensing element to the surface of the thermally conductive material for monitoring the temperature of the cooling element, and connecting the temperature sensing element by electrical leads extending externally of the laser module from the thermally conductive material to a control circuit for controlling current supplied to the cooling element by adjusting the current applied to the cooling element.

15. Apparatus for controlling the temperature of a semiconductor laser diode comprising:

a module housing the laser diode and positioned in thermal contact therewith, said module including a thermally conductive surface having a preselected configuration, a thermoelectric cooling element positioned in heat transfer relation with said module, said cooling element including a thermally conductive surface having a preselected configuration, a heat sink positioned in thermal contact with said thermoelectric cooling element, and a thermally conductive filler material positioned between said module and said cooling element in conformity with the configurations of said thermally conductive surfaces of said module and said cooling element to place said module and said cooling element in thermal contact for the transfer of heat between the laser diode and the heat sink, a temperature sensing element for monitoring the temperature of said cooling element, and said temperature sensing element secured to said thermally conductive material.

16. Apparatus for controlling the temperature of a semiconductor laser diode as set forth in claim 15 in which, said module conductive surface includes radial surface portions and planar surface portions, said cooling element conductive surface includes a planar surface abutting in limited contact area said planar surface portions of said module with the remaining portions of said cooling element conductive surface removed from contact with said module radial surface portions, and said filler material occupying the space between said module conductive surface and said cooling element conductive surface to increase the area of thermal conductivity between said radial portions of said module conductive surface and said planar surface of said cooling element.

17. Apparatus for controlling the temperature of a semiconductor laser diode as set forth in claim 15 in which, said thermally conductive material includes a metallic material shaped to conform to said thermally conductive surfaces of said module and said cooling element to increase the area of thermal conductivity between said module and said cooling element.

18. Apparatus for controlling the temperature of a semiconductor laser diode as set forth in claim 15 in which, said thermally conductive material includes injected material positioned in a space between said module and said cooling element to connect said module in heat transfer relation to said cooling element.

19. Apparatus for controlling the temperature of a semiconductor laser diode as set forth in claim 15 in which, said thermally conductive material includes molded material having a first surface conforming to said module conductive surface and a second surface conforming to said cooling element conductive surface to increase the area of thermal conductivity therebetween.

20. Apparatus for controlling the temperature of a semiconductor laser diode as set forth in claim 15 which includes, a control circuit for electrically connecting said temperature sensing element to a source of current for increasing and decreasing electrical current applied to said cooling element to increase and decrease the rate of transfer of heat between said cooling element and said module.

* * * * *